(12) United States Patent
Takahashi et al.

(10) Patent No.: US 11,039,533 B2
(45) Date of Patent: Jun. 15, 2021

(54) PRINTED WIRING BOARD AND METHOD FOR MANUFACTURING PRINTED WIRING BOARD

(71) Applicant: PANASONIC INTELLECTUAL PROPERTY MANAGEMENT CO., LTD., Osaka (JP)

(72) Inventors: Hiroaki Takahashi, Fukushima (JP); Masaya Koyama, Mie (JP); Kiyotaka Komori, Mie (JP); Yutaka Tashiro, Fukushima (JP); Hiroki Morikawa, Fukushima (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 16/486,327

(22) PCT Filed: Feb. 2, 2018

(86) PCT No.: PCT/JP2018/003652
§ 371 (c)(1),
(2) Date: Aug. 15, 2019

(87) PCT Pub. No.: WO2018/155137
PCT Pub. Date: Aug. 30, 2018

(65) Prior Publication Data
US 2020/0205286 A1 Jun. 25, 2020

(30) Foreign Application Priority Data

Feb. 23, 2017 (JP) .............................. JP2017-032558

(51) Int. Cl.
*H05K 1/05* (2006.01)
*H05K 3/10* (2006.01)
*H05K 3/46* (2006.01)

(52) U.S. Cl.
CPC ............... *H05K 1/05* (2013.01); *H05K 3/103* (2013.01); *H05K 3/4676* (2013.01);
(Continued)

(58) Field of Classification Search
CPC ........ H05K 1/05; H05K 3/103; H05K 3/4676; H05K 2201/0141; H05K 2201/0175; H05K 2201/0195
(Continued)

(56) References Cited

U.S. PATENT DOCUMENTS

| 2012/0055697 A1 | 3/2012 | Okamoto |
| 2015/0040379 A1 | 2/2015 | Okamoto |

(Continued)

FOREIGN PATENT DOCUMENTS

| JP | 2011-216841 | 10/2011 |
| JP | 2012-059756 | 3/2012 |

(Continued)

OTHER PUBLICATIONS

Official Communication issued in WIPO Patent Application No. PCT/JP2018/003652, dated May 1, 2018, along with an English translation thereof.

*Primary Examiner* — Tremesha S Willis
(74) *Attorney, Agent, or Firm* — Greenblum & Bernstein, P.L.C.

(57) ABSTRACT

A printed wiring board includes: a first insulating layer having a first surface and a second surface opposite from the first surface; a second insulating layer stacked on the first surface of the first insulating layer; and a conductor wiring interposed between the first insulating layer and the second insulating layer. The first insulating layer contains a liquid crystal polymer. The second insulating layer contains a cured product of a thermosetting composition, containing an inorganic filler and a thermosetting component, and a fibrous (Continued)

base member. A temperature, at which a decrease in the mass of the second insulating layer that has had its temperature increased at a temperature increase rate of 10° C./min from an initial-state temperature of 25° C. reaches 5% of its initial-state mass, is equal to or higher than 355° C.

10 Claims, 7 Drawing Sheets

(52) U.S. Cl.
CPC ............... *H05K 2201/0141* (2013.01); *H05K 2201/0175* (2013.01); *H05K 2201/0195* (2013.01)

(58) Field of Classification Search
USPC ........................................................ 174/258
See application file for complete search history.

(56) References Cited

U.S. PATENT DOCUMENTS

| | | |
|---|---|---|
| 2015/0047884 A1 | 2/2015 | Nagaura et al. |
| 2016/0242281 A1 | 8/2016 | Nagaura et al. |
| 2016/0333137 A1 | 11/2016 | Pan |

FOREIGN PATENT DOCUMENTS

| | | |
|---|---|---|
| JP | 2012-174769 | 9/2012 |
| JP | 2013-199082 | 10/2013 |
| JP | 2014-111719 | 6/2014 |
| JP | 2016-210777 | 12/2016 |

PRINTED WIRING BOARD AND METHOD FOR MANUFACTURING PRINTED WIRING BOARD

CROSS REFERENCE TO RELATED APPLICATION

The present application is the U.S. National Phase under 35 U.S.C. § 371 of International Application No. PCT/JP2018/003652, filed on Feb. 2, 2018, which claims the benefit of priority of Japanese Patent Application No. 2017-032558, filed on Feb. 23, 2017, the entire contents of which are incorporated herein by reference.

TECHNICAL FIELD

The present invention relates to a printed wiring board and a method for manufacturing the printed wiring board.

BACKGROUND ART

To realize a ubiquitous society, techniques for conveying information at even higher speeds have been developed continuously. To this end, printed wiring boards, including a substrate made of a liquid crystal polymer resin, a fluorocarbon polymer resin, or any other suitable material to process high-speed signals, have been provided. For example, Patent Literature 1 discloses a multilayer printed wiring board in which conductor layers and insulating layers are stacked alternately one on top of another. In such a multilayer printed wiring board, each of those insulating layers includes: a thermosetting component layer in which a thermosetting component, containing an inorganic filler and a polyphenylene ether resin, is impregnated into a piece of glass cloth before being cured; and a liquid crystal polymer resin layer. Patent Literature 1 also describes that the liquid crystal polymer resin layers account for 5 to 80 vol % of the entire insulating layers.

A substrate made of a liquid crystal polymer resin, a fluorocarbon polymer resin, or other suitable resin has a low dielectric constant and a low dielectric loss tangent, which is beneficial. This allows a printed wiring board with excellent ability to transmit high-speed signals to be manufactured using such a substrate.

CITATION LIST

Patent Literature

Patent Literature 1: JP 2011-216841 A

SUMMARY OF INVENTION

It is therefore an object of the present invention to provide a printed wiring board including an insulating layer made of a liquid crystal polymer and having the ability to reduce delamination of the insulating layer when heated and also provide a method for manufacturing such a printed wiring board.

A printed wiring board according to an aspect of the present invention includes: a first insulating layer having a first surface and a second surface opposite from the first surface; a second insulating layer stacked on the first surface of the first insulating layer; and a conductor wiring interposed between the first insulating layer and the second insulating layer. The first insulating layer contains a liquid crystal polymer. The second insulating layer contains a cured product of a thermosetting composition and a fibrous base member. The thermosetting composition contains an inorganic filler and a thermosetting component. The second insulating layer has such a property that a temperature, at which a decrease in the mass of the second insulating layer that has had its temperature increased at a temperature increase rate of 10° C./min from an initial-state temperature of 25° C. reaches 5% of its initial-state mass, is equal to or higher than 355° C. when measured by thermogravimetric-differential thermal analysis.

A method for manufacturing a printed wiring board according to another aspect of the present invention includes providing a first insulating layer containing a liquid crystal polymer, a metal foil sheet having a matted surface with a plurality of protrusions having an average diameter falling within a range from 0.1 μm to 1.0 μm, and a prepreg. The prepreg has the property of turning into a cured product when cured. The cured product has such a property that a temperature, at which a decrease in the mass of the cured product that has had its temperature increased at a temperature increase rate of 10° C./min from an initial-state temperature of 25° C. reaches 5% of its initial-state mass, is equal to or higher than 355° C. when measured by thermogravimetric-differential thermal analysis. The method further includes putting the matted surface of the metal foil sheet on the first insulating layer to make thermal compression bonding of the metal foil sheet onto the first insulating layer; etching and patterning the metal foil sheet into a conductor wiring; and putting the prepreg over the surface, having the conductor wiring, of the first insulating layer and heating and curing the prepreg to form a second insulating layer.

Another method for manufacturing a printed wiring board according to still another aspect of the present invention includes providing a first insulating layer containing a liquid crystal polymer, a metal foil sheet having a matted surface with a plurality of protrusions having an average diameter less than 1.0 μm, and a prepreg. The prepreg has the property of turning into a cured product when cured. The cured product has such a property that a temperature, at which a decrease in the mass of the cured product that has had its temperature increased at a temperature increase rate of 10° C./min from an initial-state temperature of 25° C. reaches 5% of its initial-state mass, is equal to or higher than 355° C. when measured by thermogravimetric-differential thermal analysis. The method further includes: putting the matted surface of the metal foil sheet on the first insulating layer to make thermal compression bonding of the metal foil sheet onto the first insulating layer; etching and patterning the metal foil sheet into a conductor wiring; and subjecting a surface, exposed by etching, of the first insulating layer to plasma treatment; putting the prepreg over the first insulating layer to make the prepreg face the conductor wiring; and heating and curing the prepreg to form a second insulating layer.

DESCRIPTION OF EMBODIMENTS

First of all, it will be described how the present inventors perfected our invention. An insulating layer made of a fluorocarbon polymer resin as disclosed in Patent Literature 1 (JP 2011-216841 A) tends to absorb moisture relatively easily and vary its dielectric property when absorbing moisture. Thus, a printed wiring board including an insulating layer made of a fluorocarbon polymer resin may be unable to exhibit stabilized performance. In contrast, an insulating layer made of a liquid crystal polymer hardly absorbs moisture and its dielectric property hardly varies. Consequently, a printed wiring board including an insulating layer made of a liquid crystal polymer is able to exhibit stabilized performance.

Nevertheless, when the printed wiring board is heated, an insulating layer made of a liquid crystal polymer tends to delaminate more easily than an insulating layer made of a fluorocarbon polymer resin. Thus, when the printed wiring board is heated for the purpose of performing reflow processing to mount respective parts together, the insulating layer may delaminate, thus causing a decline in production yield.

Thus, the present inventors arrived at, via extensive research and development, an inventive idea of providing a printed wiring board including an insulating layer made of a liquid crystal polymer and having the ability to reduce the chances of the insulating layer delaminating even under heat and also providing a method for manufacturing such a printed wiring board.

Embodiments of the present invention will now be described.

A printed wiring board 1 includes: a first insulating layer 21 having a first surface 41 and a second surface 42 opposite from the first surface 41; a second insulating layer 22 stacked on the first surface 41 of the first insulating layer 21; and a conductor wiring 3 interposed between the first insulating layer 21 and the second insulating layer 22. The first insulating layer 21 contains a liquid crystal polymer. The second insulating layer 22 contains a cured product of a thermosetting composition, containing an inorganic filler and a thermosetting component, and a fibrous base member. The second insulating layer 22 has such a property that a temperature, at which a decrease in the mass of the second insulating layer 22 that has had its temperature increased at a temperature increase rate of 10° C./min from an initial-state temperature of 25° C. reaches 5% of its initial-state mass, is equal to or higher than 355° C.

This embodiment provides a printed wiring board 1 including a first insulating layer 21 made of a liquid crystal polymer and having the ability to reduce the chances of the first insulating layer 21 delaminating even when heated.

Figure 1:
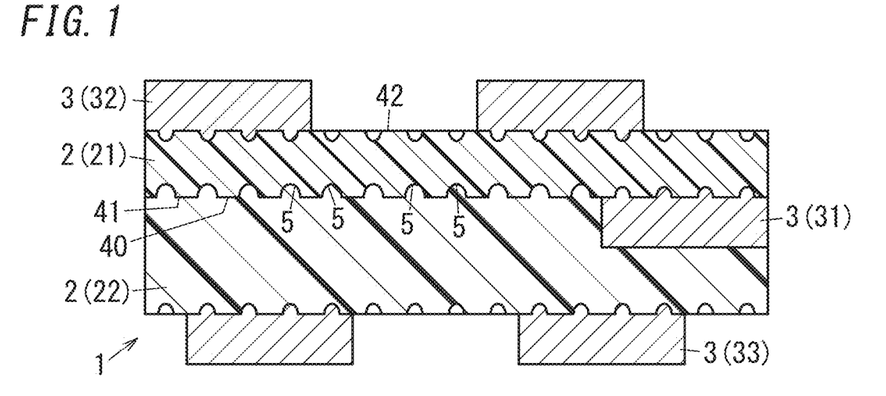
FIG. 1 is a schematic cross-sectional view of a printed wiring board according to a first embodiment of the present invention.

A printed wiring board 1 according to a first embodiment is shown in FIG. 1. The printed wiring board 1 includes a plurality of insulating layers 2. The plurality of insulating layers 2 includes a first insulating layer 21, and a second insulating layer 22 stacked on the first insulating layer 21. The printed wiring board 1 further includes at least one conductor wiring 3.

The first insulating layer 21 has a first surface 41 and a second surface 42 opposite from the first surface 41. The printed wiring board 1 may include at least the first insulating layer 21, the second insulating layer 22 stacked on the first surface 41 of the first insulating layer 21, and the conductor wiring 3(31) interposed between the first insulating layer 21 and the second insulating layer 22. In this first embodiment, the printed wiring board 1 further includes a conductor wiring 3(32) stacked on the second surface 42 of the first insulating layer 21, and a conductor wiring 3(33) stacked on the other surface, facing away from the first insulating layer 21, of the second insulating layer 22. That is to say, the printed wiring board 1 has a structure in which the conductor wiring 32, the first insulating layer 21, the conductor wiring 31, the second insulating layer 22, and the conductor wiring 33 are stacked one on top of another in this order. The conductor wirings 32 and 33 are provided on the two outermost layers of the printed wiring board 1.

The first insulating layer 21 contains a liquid crystal polymer. On the other hand, the second insulating layer 22 contains a cured product of a thermosetting composition, containing an inorganic filler and a thermosetting component, and a fibrous base member. The second insulating layer 22 has such a property that a temperature, at which a decrease in the mass of the second insulating layer 22 that has had its temperature increased at a temperature increase rate of 10° C./min from an initial-state temperature of 25° C. reaches 5% of its initial-state mass, is equal to or higher than 355° C. when measured by thermogravimetric-differential thermal analysis. Such a temperature will be hereinafter referred to as an "index temperature." Also, T288 between the first insulating layer 21 and the second insulating layer 22 is suitably equal to or longer than 5 minutes. As used herein, T288 refers to a time to delamination at 288° C. to be measured by a mechanical test method (thermomechanical analysis (TMA) method) defined by IPC-TM-650 2.4 24.1.

According to the first embodiment, the first insulating layer 21 contains a liquid crystal polymer, and therefore, is able to have a low dielectric constant and a low dielectric loss tangent. Thus, the printed wiring board 1 has excellent ability to transmit high-speed signals. Particularly when the printed wiring board 1 has an antenna including the first insulating layer 21, the printed wiring board 1 may have a sufficient capability of converting and transmitting radio frequency (RF) signals.

In addition, the first insulating layer 21 contains a liquid crystal polymer, and therefore, may have the property of hardly absorbing moisture. That is why the first insulating layer 21 is less likely to have its dielectric property affected by moisture absorption, thus allowing the printed wiring board 1 to have stabilized performance.

Furthermore, even when the printed wiring board 1 is heated, the first embodiment reduces the chances of the first insulating layer 21 delaminating from the second insulating layer 22 for the following reasons according to the research carried out by the present inventors:

An insulating layer containing a liquid crystal polymer has the property of hardly absorbing moisture but transmitting a gas much less easily. Therefore, when a gas is emitted from an interface between such an insulating layer containing a liquid crystal polymer and another insulating layer stacked on the former insulating layer, the gas tends to stagnate at the interface without being transmitted through the insulating layer containing the liquid crystal polymer. For that reason, when the gas expands when heated, delamination occurs easily between the two insulating layers.

In contrast, according to the first embodiment, the second insulating layer 22 stacked on the first insulating layer 21 containing the liquid crystal polymer has an index temperature equal to or higher than 355° C., and therefore, a gas is not emitted easily from the second insulating layer 22 even when the printed wiring board 1 is heated. In particular, according to a normal heating condition for reflow processing, the emission of such a gas from the second insulating layer 22 is reducible sufficiently. This reduces the chances of the gas emitted from the second insulating layer 22 stagnating in the interface between the first insulating layer 21 and the second insulating layer 22. Consequently, this reduces the delamination of the first insulating layer 21 from the second insulating layer 22 when the printed wiring board 1 is heated, thus achieving T288 of 5 minutes or more between the first insulating layer 21 and the second insulating layer 22.

Next, the printed wiring board 1 according to the first embodiment will be described in further detail.

The printed wiring board 1 according to the first embodiment includes two insulating layers 2, namely, a first insulating layer 21 and a second insulating layer 22 stacked on the first insulating layer 21. The first insulating layer 21 has a first surface 41 and a second surface 42 opposite from the first surface 41. The second insulating layer 22 is stacked on the first surface 41. In addition, according to the first embodiment, the printed wiring board 1 includes three conductor wirings (31, 32, and 33). As described above, the conductor wiring 32, the first insulating layer 21, the conductor wiring 31, the second insulating layer 22, and the conductor wiring 33 are stacked one on top of another in this order. That is to say, the conductor wirings 3 and the insulating layers 2 are arranged alternately. In this embodiment, the conductor wirings 32 and 33 respectively form the two outermost layers of the printed wiring board 1. However, this is only an example and should not be construed as limiting. Alternatively, the conductor wiring 3 may form only one of the two outermost layers. Still alternatively, no conductor wirings 3 may form any of the two outermost layers.

The first insulating layer 21 contains a liquid crystal polymer as described above. The first insulating layer 21 may contain the liquid crystal polymer with or without an appropriate additive. The first insulating layer 21 suitably contains no inorganic fillers. In that case, the chances of the first insulating layer 21 absorbing moisture are reducible particularly significantly.

The liquid crystal polymer may contain at least one component selected from the group consisting of polycondensates of ethylene terephthalate and para-hydroxybenzoic acid, polycondensates of phenol, phthalic acid, and para-hydroxybenzoic acid, and polycondensates of 2,6-hydroxynaphthoic acid and para-hydroxybenzoic acid.

The first insulating layer 21 may have a thickness falling within the range from 0.025 mm to 0.300 mm. However, this is only an example and should not be construed as limiting.

The second insulating layer 22 contains a cured product of a thermosetting composition and a fibrous base member. A prepreg 10 may be obtained by heating the fibrous base member, which has been impregnated with the thermosetting composition, such that the thermosetting composition is dried or semi-cured. The second insulating layer 22 is obtained by heating the prepreg 10. That is to say, the second insulating layer 22 may be a cured product of the prepreg 10. To allow the second insulating layer 22 to have an index temperature equal to or higher than 355° C., the cured product of the prepreg 10 suitably has an index temperature equal to or higher than 355° C. That is to say, the second insulating layer 22 is suitably made of the prepreg 10. The prepreg 10 suitably has the property of turning into a cured product when cured. The cured product suitably has such a property that a temperature, at which a decrease in the mass of the cured product that has had its temperature increased at a temperature increase rate of 10° C./min from an initial-state temperature of 25° C. reaches 5% of its initial-state mass, is equal to or higher than 355° C.

The fibrous base member may be a glass fiber base member, for example, and is suitably a piece of glass cloth.

The thermosetting composition contains a thermosetting component and an inorganic filler.

In the first embodiment, the component contained in the thermosetting component only needs to have a thermosetting property and does not have to be a macromolecule. Optionally, the thermosetting component may contain a plurality of components. The thermosetting component may contain at least one component selected from the group consisting of epoxy compounds, phenolic resins, imide resins, cyanate ester resins, isocyanate resins, modified polyphenylene ether resins, benzoxazine resins, and oxetane resins.

Among other things, the thermosetting component suitably contains an epoxy compound. This would increase the degree of close contact between the first insulating layer 21 and the second insulating layer 22.

When the thermosetting component contains an epoxy compound, the epoxy compound may contain at least one component selected from the group consisting of: bisphenol type epoxy compounds such as a bisphenol A type epoxy compound, a bisphenol F type epoxy compound, and a bisphenol S type epoxy compound; novolak type epoxy compounds such as a phenol novolak type epoxy compound and a cresol novolak type epoxy compound; aryl-alkylene type epoxy compounds such as a biphenyl type epoxy compound, a xylylene type epoxy compound, a phenol aralkyl type epoxy compound, a biphenyl aralkyl type epoxy compound, a biphenyl dimethylene type epoxy compound, a trisphenolmethane novolak type epoxy compound, and a tetramethyl biphenyl type epoxy compound; glycidyl ethers; trifunctional or tetrafunctional glycidyl amines; naphthalene skeleton-modified epoxy compounds such as a naphthalene skeleton-modified cresol novolak type epoxy compound, a methoxy naphthalene-modified cresol novolak type epoxy compound, and a methoxy naphthalene dimethylene type epoxy compound; anthracene-type epoxy compounds; dicyclopentadiene type epoxy compounds; norbornene-type epoxy compounds; fluorene type epoxy compounds; and flame retardant epoxy compounds obtained by halogenating these resins.

The second insulating layer 22 is suitably halogen-free, in particular. This reduces the chances of a halogen compound being produced from the printed wiring board 1 discarded. In addition, when halogen-free, the second insulating layer 22 may have excellent insulation reliability as well. As used herein, being "halogen-free" refers to either containing no halogens or adding no halogens intentionally.

When containing an epoxy compound, the thermosetting component suitably further contains a curing agent.

To make the second insulating layer 22 halogen-free, the curing agent suitably contains no halogens. The curing agent contains at least one of a phenolic curing agent or an amine curing agent. The phenolic curing agent contains at least one of, for example, a polyhydric phenol compound or a polyhydric naphthol compound. Examples of the polyhydric phenol compounds include a phenol novolak resin, a cresol novolak resin, a bisphenol A type novolak resin, a phenol aralkyl resin, and a biphenyl aralkyl resin. Examples of the polyhydric naphthol compounds include a naphthol aralkyl resin. The amine curing agent contains, for example, at least one of dicyandiamide or diaminodiphenylmethane. The ratio of the equivalent of the curing agent to the equivalent of an epoxy group in the epoxy compound may fall within the range from 0.4 to 1.4, for example. However, this is only an example and should not be construed as limiting.

When the thermosetting component contains an epoxy compound, the thermosetting composition suitably contains a curing accelerator. The curing accelerator may contain at least one component selected from the group consisting of: imidazole compounds such as 2-methylimidazole and 2-phenylimidazole; tertiary amines such as triethylenediamine; and organic phosphine compounds such as triphenylphosphine. The content of the curing accelerator may fall, for example, within the range from 0.040 mass % to 0.450 mass % with respect to the total mass of the epoxy compound and curing agent.

The inorganic filler is used to improve the thermal resistance and flame retardant property of the cured product of the thermosetting composition, decrease the expansion coefficient thereof, and improve the thermal conductivity thereof, for example. Particularly when the second insulating layer 22 is halogen-free, the thermosetting composition suitably contains the inorganic filler to ensure an excellent flame retardant property for the second insulating layer 22. The inorganic filler contains at least one component selected from the group consisting of aluminum hydroxide, magnesium hydroxide, magnesium hydroxide-based composite metal hydroxides, zinc borate, boron nitride, silicon nitride, barium sulfate, talc, clay, mica, silica, and hydrotalcite. The inorganic filler suitably contains aluminum hydroxide, among other things.

The inorganic filler may have a mean particle size falling within the range from 0.1 μm to 5 μm, for example. However, this is only an example and should not be construed as limiting. Note that the mean particle size refers herein to a volume-based arithmetic mean to be calculated based on a particle size distribution measured by laser diffraction/scattering method.

Optionally, the inorganic filler may be coated with a compound such as a coupling agent. Coating the inorganic filler with a coupling agent improves the thermal resistance of the second insulating layer 22 because this allows the thermosetting component and the inorganic filler to make a sufficiently close contact with each other at their interface. When the inorganic filler is coated with a compound, the compound coating the inorganic filler is suitably hardly pyrolyzable to set the index temperature of the second insulating layer 22 at a temperature equal to or higher than 355° C.

The present inventors paid special attention to the gas emitted by the pyrolysis of the compound coating the inorganic filler. The present inventors discovered via experiment that the gas was emitted too much to be negligible in order to reduce the delamination of the first insulating layer 21 from the second insulating layer 22. That is why when the inorganic filler is coated with a compound, the compound is suitably not easily pyrolyzable to reduce the delamination of the first insulating layer 21 from the second insulating layer 22.

Particularly when the inorganic filler contains aluminum hydroxide that is coated with a compound, the compound coating the aluminum hydroxide is suitably at least one organic silane coupling agent selected from the group consisting of epoxy silane, amino silane, methoxysilane, vinylsilane, methacrylic silane, and mercaptosilane. That is to say, the aluminum hydroxide is suitably subjected to a coupling treatment with an organic silane coupling agent. In that case, the compound coating the aluminum hydroxide has too high a hydrolysis temperature to be pyrolyzable easily. This not only allows the second insulating layer 22 to have an index temperature equal to or higher than 355° C. but also reduces the delamination of the first insulating layer 21 from the second insulating layer 22 as well.

The content of the inorganic filler suitably falls within the range from 10 to 400 parts by mass, and more suitably falls within the range from 20 to 200 parts by mass, relative to 100 parts by mass of the entire thermosetting component (when the thermosetting component consists of an epoxy compound and a curing agent, the total mass of the epoxy compound and the curing agent).

Optionally, the thermosetting composition may contain a flame retardant. The thermosetting composition containing a flame retardant improves the flame retardant property of the printed wiring board 1. The flame retardant includes at least one component selected from the group consisting of halogen-based flame retardants, phosphate-ester-based flame retardants, phosphazene-based flame retardants, and phosphinic acid salt-based flame retardants. The halogen-based flame retardant contains at least one component selected from the group consisting of ethylene dipentabromobenzene, ethylene bis-tetrabromoimide, decabromo diphenyl oxide, and tetradecabromo diphenoxybenzene. The phosphate-ester-based flame retardant contains a condensed phosphate ester of dixylenyl phosphate. The phosphazene-based flame retardant contains, for example, phenoxy phosphazene. The phosphinic acid salt-based flame retardant contains, for example, a phosphinic acid metal salt of dialkylphosphinic acid aluminum salt. To make the second insulating layer 22 halogen-free, the flame retardant suitably contains no halogens. For that purpose, the flame retardant suitably includes only at least one component selected from the group consisting of phosphate-ester-based flame retardants, phosphazene-based flame retardants, and phosphinic acid salt-based flame retardants. The content of the flame retardant may, but does not have to, be defined such that the content of phosphorus atoms in the flame retardant falls within the range from 1.8 to 5.2 parts by mass relative to 100 parts by mass of the total mass of the thermosetting component and the flame retardant.

The thermosetting composition may contain an appropriate amount of additives as far as the effect of the present invention is ruined. Examples of the additives include defoamers, antioxidants, heat stabilizers, antistatic agents, UV absorbers, dyes, pigments, and lubricants.

The thermosetting composition may further contain a solvent as needed. Examples of the solvents include at least one component selected from the group consisting of toluene, cyclohexanone, and propylene glycol monomethyl ether acetate. However, these are only examples and should not be construed as limiting.

To prepare the thermosetting composition, for example, a component dissolvable in a solvent (such as a thermosetting component), out of the components of the thermosetting composition, is mixed with the solvent first, and then heated as needed to obtain a mixture. Next, a component non-dissolvable in the solvent (such as an inorganic filler) is added to the mixture and allowed to be dispersed with a bowl mill, a beads mill, a planetary mixer, or a roll mill. In this manner, a thermosetting composition in the form of varnish is obtained.

The thermosetting composition is impregnated into a fibrous base member and then heated so as to be dried or semi-cured, thereby obtaining a prepreg 10. The heating process may be conducted under conditions including a heating temperature falling within the range from 80° C. to 170° C. and a heating duration of 1 to 10 minutes, for example.

As will be described in detail later, the second insulating layer 22 may be formed by heating and pressing, and thereby curing, the prepreg 10. The heating process may be conducted under conditions including a heating temperature falling within the range from 170° C. to 210° C., a pressing pressure falling within the range from 3.5 to 4.0 MPa, and a heating duration of 60 to 150 minutes, for example.

Next, a method for manufacturing the printed wiring board 1 will be described.

To manufacture the printed wiring board 1, first, a first insulating layer 21 containing a liquid crystal polymer, a metal foil sheet 61 with a matted surface 7, and a prepreg 10 with the property of turning, when cured, into a cured product with an index temperature equal to or higher than 355° C. are provided. The metal foil sheet 61 and the first insulating layer 21 are subjected to thermal compression bonding with the matted surface 7 of the metal foil sheet 61 put on the first insulating layer 21. Subsequently, the metal foil sheet 61 is etched to be patterned into conductor wiring 31. Then, the prepreg 10 is put over the surface, having the conductor wiring 31, of the first insulating layer 21 and then heated and cured to form a second insulating layer 22.

A more specific exemplary method for manufacturing the printed wiring board 1 will be described.

First, a liquid crystal polymer base member 9 (hereinafter referred to as an "LCP member 9"), a prepreg 10, and a metal foil sheet 63 are provided.

The metal foil sheet 63 may be a copper foil sheet, for example.

The LCP member 9 includes at least a first insulating layer 21 and a conductor wiring 31 stacked on the first insulating layer 21.

An exemplary method of making the LCP member 9 will be described with reference to FIGS. 2A-2D. The LCP member 9 is made up of a single film of the first insulating layer 21 and two metal foil sheets 61, 62. The configuration of the first insulating layer 21 is as described above. The metal foil sheets 61, 62 may be copper foil sheets, for example. At least one 61 of the two metal foil sheets 61, 62 suitably has a matted surface 7 with protrusions 8.

Figure 2A:
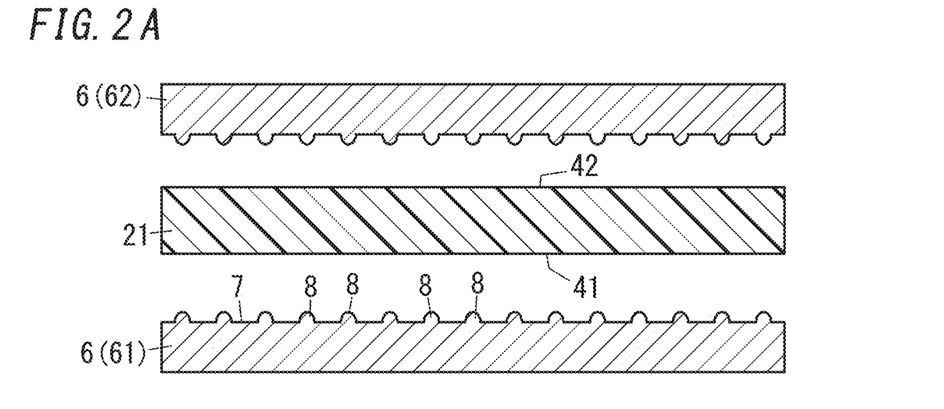
FIGS. 2A-2D are schematic cross-sectional views illustrating manufacturing process steps of an LCP member for use to manufacture the printed wiring board shown in FIG. 1.

To make the LCP member 9, first, the metal foil sheet 61 is put on the first surface 41 of the first insulating layer 21 such that the matted surface 7 thereof faces the first insulating layer 21, for example. In this first embodiment, the metal foil sheet 62 is also put on the second surface 42 of the first insulating layer 21 as shown in FIG. 2A.

Figure 2B:
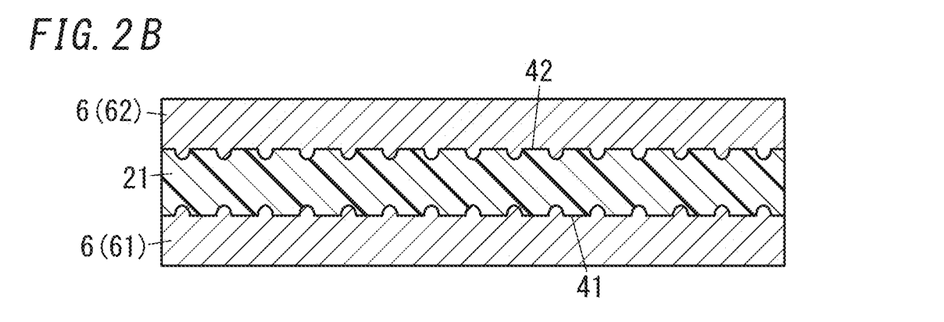

Next, the first insulating layer 21 and the two metal foil sheets 61, 62 are subjected to thermal compression bonding as shown in FIG. 2B by, for example, hot-pressing the metal foil sheets 61, 62 onto the first insulating layer 21. The hot pressing process may be conducted under conditions including a heating temperature falling within the range from 150 to 200° C., a pressing pressure falling within the range from 2 to 5 MPa, and a duration of 40 to 120 minutes.

Figure 2C:
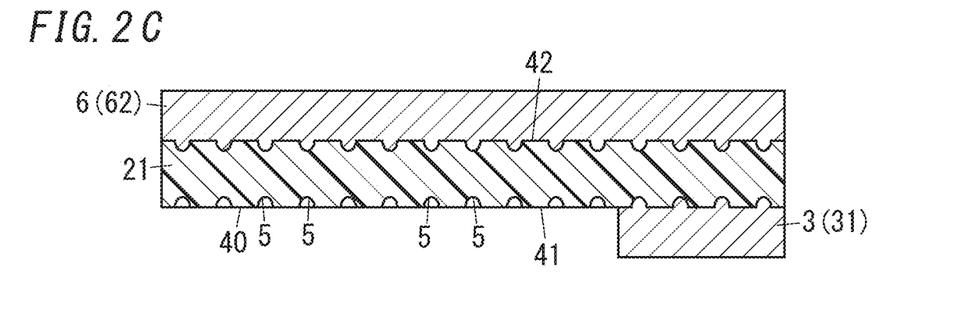

Subsequently, as shown in FIG. 2C, the metal foil sheet 61 on the first surface 41 of the first insulating layer 21 is etched and patterned into the shape of a conductor wiring 31. If necessary, a through hole may be cut through the first insulating layer 21 in this process step. In this manner, an LCP member 9, including the metal foil sheet 62, the first insulating layer 21, and the conductor wiring 31 that are stacked one on top of another in this order, is obtained. The etching process may be performed by a known technique. As a result of this etching process, a region 40, exposed by etching, of the first insulating layer 21 has depressions 5 that have been formed by transferring the shape of protrusions 8 of the metal foil sheet 61. The depressions 5 formed on the first insulating layer 21 suitably have an average opening diameter falling within the range from 0.1 to 1.0 µm. As used herein, the opening diameter of any of the depressions 5 refers to the major-axis dimension of the opening.

To form such depressions 5 with an average opening diameter falling within the range from 0.1 to 1.0 µm, the protrusions 8 on the matted surface 7 of the metal foil sheet 61 suitably have an average diameter falling within the range from 0.1 to 1.0 µm. As used herein, the diameter of the protrusions 8 refers to the major-axis dimension thereof in a plan view of the matted surface 7. In that case, the average opening diameter of the depressions 5 formed by transferring the protrusions 8 agrees with the average diameter of the protrusions 8 and falls within the range from 0.1 to 1.0 µm.

Figure 2D:
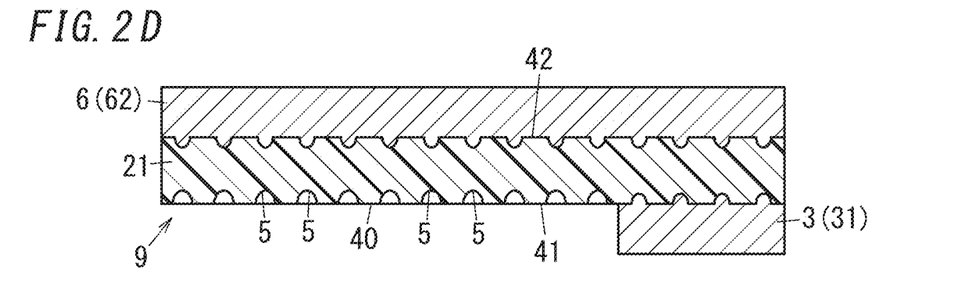

To form such depressions 5 with an average opening diameter of 0.1 to 1.0 µm, not only the protrusions 8 on the matted surface 7 of the metal foil sheet 61 may have an average diameter less than 1.0 µm but also the region 40 exposed as a result of etching the first insulating layer 21 may be subjected to plasma treatment. In that case, creating or expanding the depressions 5 by plasma treatment as shown in FIG. 2D allows depressions 5 to have an average opening diameter falling within the range from 0.1 to 1.0 µm. As conditions for the plasma treatment, appropriate conditions for a known metal etching process may be adopted. For example, depressions 5 with an average opening diameter falling within the range from 0.1 to 1.0 µm may be formed by microwave-excited surface wave plasma treatment using an $O_2/CF_4$ mixed gas as a seed of plasma gas.

The sum of the respective opening areas of the depressions 5 suitably accounts for at least 60%, more suitably 80% or more, and even more suitably 85% or more, of the overall area of the region 40 of the first surface 41. However, this is only an example and should not be construed as limiting. Furthermore, the average depth of the depressions 5 suitably falls within the range from 0.1 to 1.0 µm, and more suitably falls within the range from 0.5 to 1.0 µm.

The prepreg 10 is a material for making the second insulating layer 22. The prepreg 10 has the property of turning, when cured, into a cured product having an index temperature equal to or higher than 355° C. As described above, the prepreg 10 may be obtained by heating the fibrous base member, which has been impregnated with the thermosetting composition, such that the thermosetting composition is dried or semi-cured. The heating process may be conducted under conditions including a heating temperature falling within the range from 80 to 170° C. and a heating duration of 1 to 10 minutes as described above.

To allow the prepreg 10 to be cured and turn into a cured product with an index temperature equal to or higher than 355° C., if the inorganic filler in the thermosetting composition to make the second insulating layer 22 is coated with a compound described above, the compound is suitably hardly pyrolyzable.

In addition, to allow the prepreg 10 to be cured and turn into a cured product with an index temperature equal to or higher than 355° C., before the thermosetting composition is impregnated into the fibrous base member, one or both of the thermosetting composition and the fibrous base member are suitably dehydrated. For this purpose, either the thermosetting composition or the fibrous base member or both of them are suitably stored in a storage chamber with a low temperature and low humidity.

Furthermore, to allow the prepreg 10 to be cured and turn into a cured product with an index temperature equal to or higher than 355° C., the prepreg 10 itself is also suitably dehydrated. For this purpose, the prepreg 10 may be vacuum dried, for example.

Figure 3A:
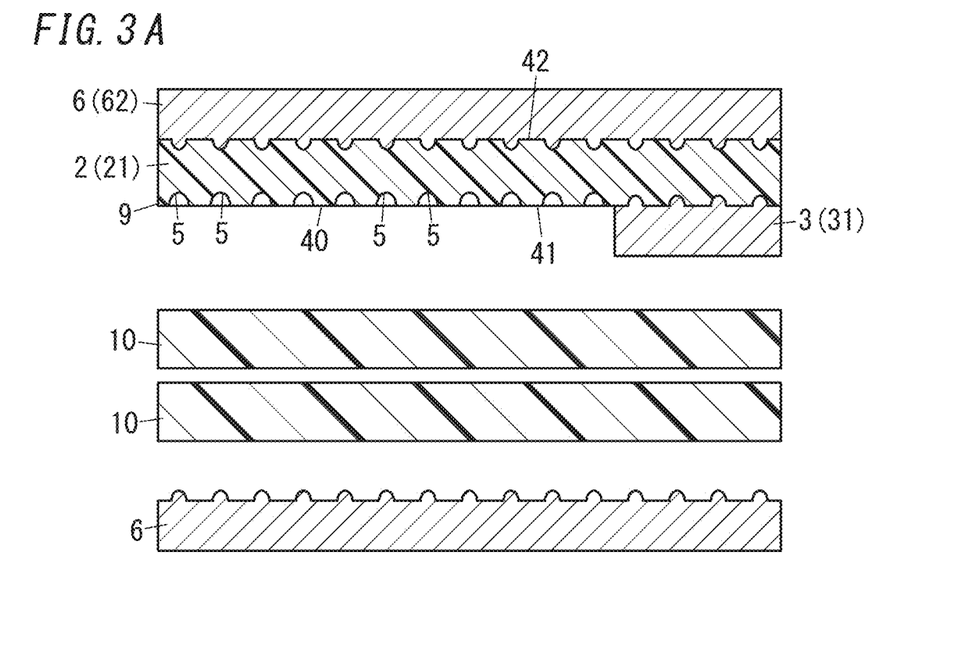
FIGS. 3A and 3B are schematic cross-sectional views illustrating manufacturing process steps of the printed wiring board shown in FIG. 1.

As shown in FIG. 3A, the LCP member 9 described above, at least one prepreg 10 (e.g., two prepregs 10 in the first embodiment), and a metal foil sheet 63 are stacked one on top of another in this order to obtain a multilayer structure. In this multilayer structure, the prepregs 10 are stacked on the first insulating layer 21 and the conductor wiring 32 is interposed between the first insulating layer 21 and the prepregs 10. In addition, the first insulating layer 21 is in contact with the prepregs 10 at the region 40 with the depressions 5.

Figure 3B:
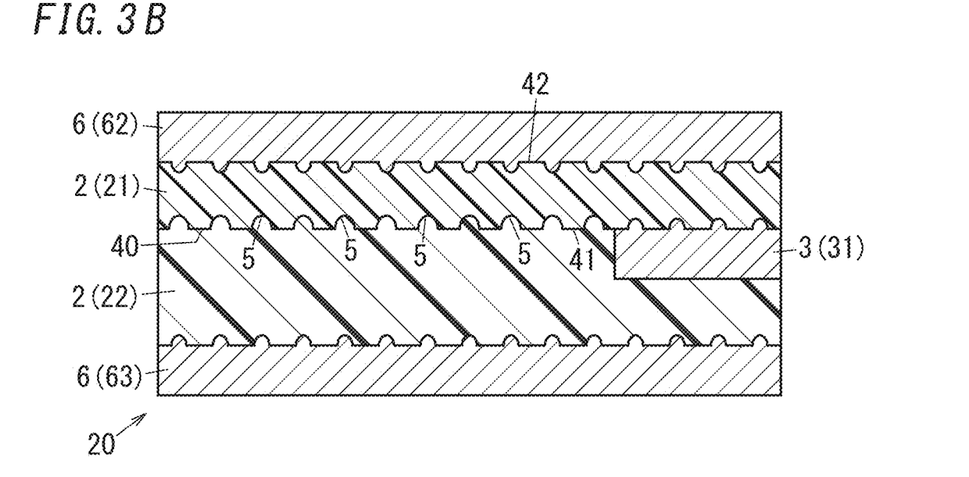

This multilayer structure is subjected to hot pressing. The hot pressing process may be conducted under conditions including a heating temperature falling within the range from 170 to 210° C., a pressing pressure falling within the range from 3.5 to 4.0 MPa, and a heating duration falling within the range from 60 to 150 minutes. This hot pressing causes the prepregs 10 to be once melted and then cured to turn into the second insulating layer 22, which is then bonded to the LCP member 9 and the metal foil sheet 63. While being melted, the prepregs 10 flow to fill the depressions 5 in the region 40 of the first insulating layer 21. Thus, the surface, stacked in contact with the first insulating layer 21, of the second insulating layer 22 made from the prepregs 10 has a shape matching that of the region 40, stacked in contact with the second insulating layer 22, of the first insulating layer 21, and the first insulating layer 21 and the second insulating layer 22 make close contact with each other so as to be engaged with each other. In this manner, an intermediate product 20 in which the metal foil sheet 62, the first insulating layer 21, the conductor wiring 31, the second insulating layer 22, and the metal foil sheet 63 are stacked one on top of another in this order is obtained as shown in FIG. 3B.

Subsequently, the two metal foil sheets 62 and 63 respectively forming the two outermost layers of the intermediate product 20 are patterned by etching, for example, into conductor wirings 32 and 33 as the outermost layers. If necessary, a through hole may be cut through the first insulating layer 21 and the second insulating layer 22. In this manner, a printed wiring board 1, having a structure in which the conductor wiring 32, the first insulating layer 21, the conductor wiring 31, the second insulating layer 22, and the conductor wiring 33 are stacked one on top of another in this order, is obtained as shown in FIG. 1.

In this printed wiring board 1, the second insulating layer 22 has an index temperature equal to or higher than 355° C. as described above, and therefore, the first insulating layer 21, notwithstanding containing a liquid crystal polymer, does not delaminate easily from the second insulating layer 22 even when heated.

In addition, in this printed wiring board 1, the region 40, stacked in contact with the second insulating layer 22, of the first insulating layer 21 has depressions 5 with an average opening diameter falling within the range from 0.1 to 1.0 µm. Thus, bringing the second insulating layer 22 in engagement with the depressions 5 of the first insulating layer 21 achieves a sufficient degree of close contact between the first insulating layer 21 and the second insulating layer 22. This further reduces the chances of the first insulating layer 21 delaminating from the second insulating layer 22 when the printed wiring board 1 is heated.

As described above, the depressions 5 suitably have an average opening diameter falling within the range from 0.1 to 1.0 µm. This range is preferred for the following reasons. Specifically, the average opening diameter of 1.0 µm or less allows the first insulating layer 21 and the second insulating layer 22 to engage firmly with each other, thus increasing the degree of close contact between the first insulating layer 21 and the second insulating layer 22. Meanwhile, the average opening diameter of 0.1 µm or more allows the prepregs 10, which are heated and melted while being stacked on the first insulating layer 21, to flow smoothly inside the depressions 5. This brings the second insulating layer 22 into even smoother engagement with the first insulating layer 21, thus increasing the degree of close contact between the first insulating layer 21 and the second insulating layer 22. In addition, this also reduces the chances of gaps being left between the first insulating layer 21 and the second insulating layer 22, thus further increasing the degree of close contact between the first insulating layer 21 and the second insulating layer 22.

Furthermore, to allow the prepregs 10, which are heated and melted while being stacked on the first insulating layer 21, to flow smoothly enough to fill the depressions 5, the prepregs 10 suitably have a low melt viscosity. In particular, the prepregs 10 suitably have a lowest melt viscosity of 10,000 P or less as measured when the temperature of the prepregs 10 is increased from 80° C. to 150° C. at a temperature increase rate of 2° C./min. The lowest melt viscosity of the prepregs 10 is adjustable by appropriately selecting components included in the thermosetting composition to make the prepregs 10 and their contents.

As described above, the printed wiring board 1 according to the first embodiment includes the conductor wiring 32 stacked on the second surface 42 of the first insulating layer 21. Instead of such a conductor wiring 32, the printed wiring board 1 may include a metal layer of the non-patterned metal foil sheet 62 stacked on the second surface 42 of the first insulating layer 21 as in the intermediate product 20. In addition, the printed wiring board 1 according to the first embodiment also includes the conductor wiring 33 stacked on the other surface, opposite from the one facing the first insulating layer 21, of the second insulating layer 22. Instead of such a conductor wiring 33, the printed wiring board 1 may include a metal layer of the non-patterned metal foil sheet 63 stacked on the other surface, opposite from the one facing the first insulating layer 21, of the second insulating layer 22 as in the intermediate product 20. That is to say, the printed wiring board 1 may include a non-patterned metal layer as at least one of the two outermost layers thereof. Optionally, even the intermediate product including the two metal foil sheets 62 and 63 may be used as it is as the printed wiring board 1.

The printed wiring board 1 according to the first embodiment may include not only an antenna including the second insulating layer 22 and the conductor wiring 32 as the outermost layer, located over the second insulating layer 22, but also a control circuit including a conductor wiring 3 other than the conductor wiring 32 as the outermost layer. This provides a printed wiring board 1 suitable for transmitting and receiving RF signals.

In the printed wiring board 1 according to the first embodiment shown in FIG. 1, the insulating layers 2 include only the first insulating layer 21 and the second insulating layer 22. However, this is only an example and should not be construed as limiting. The printed wiring board 1 may include one or more insulating layers in addition to the first insulating layer 21 and the second insulating layer 22. That is to say, the printed wiring board 1 may have three or more insulating layers 2 including the first insulating layer 21 and the second insulating layer 22. In that case, out of the three or more insulating layers 2 in the printed wiring board 1, the outermost one 2 suitably serves as the first insulating layer 21.

Figure 4:
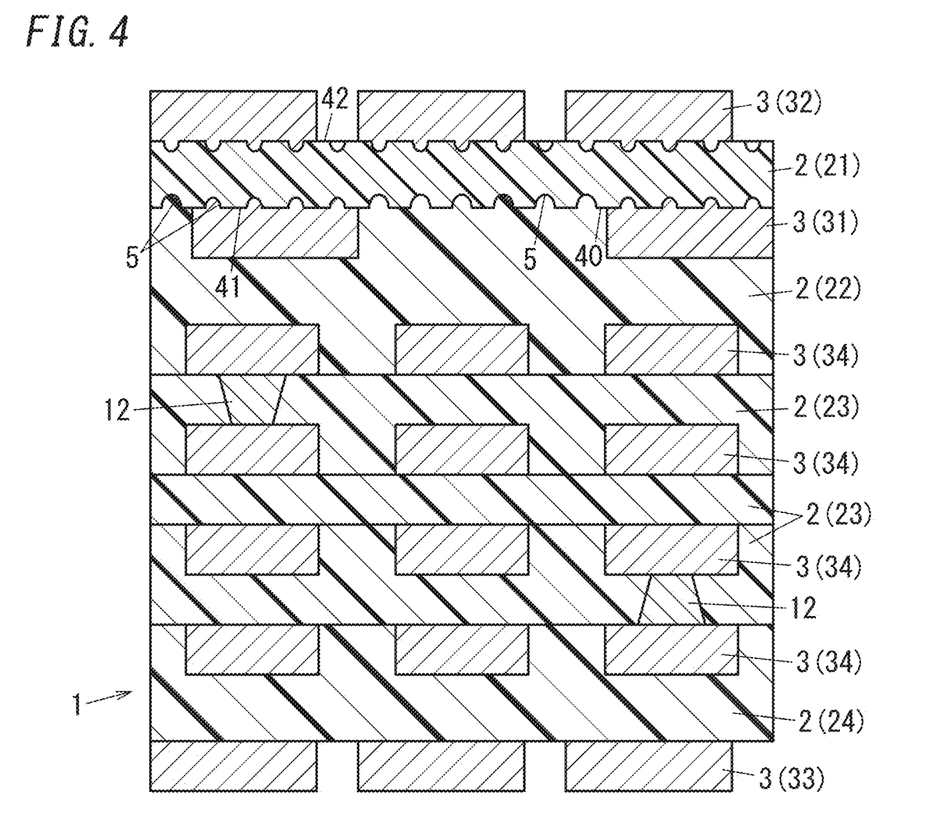
FIG. 4 is a schematic cross-sectional view of a printed wiring board according to a second embodiment of the present invention.

Next, a printed wiring board 1 according to a second embodiment will be described. In the second embodiment, the printed wiring board 1 includes three or more insulating layers 2, and multiple conductor wirings 3 as shown in FIG. 4.

These insulating layers 2 are stacked one on top of another along their thickness. Specifically, the insulating layers 2 include: the first insulating layer 21 having the first surface 41 and the second surface 42 opposite from the first surface 41; the second insulating layer 22 stacked on the first surface 41 of the first insulating layer 21; and one or more additional insulating layers. That is to say, the first insulating layer 21, the second insulating layer 22, and the additional insulating layers are stacked one on top of another in this order. The conductor wirings 3 are provided on the two outermost layers of the printed wiring board 1 and between adjacent ones of the insulating layers 2.

The first insulating layer 21, the second insulating layer 22, the conductor wiring 32 provided on the second surface 42 of the first insulating layer 21, and the conductor wiring 31 provided between the first insulating layer 21 and the second insulating layer 22 may each have the same configuration as their counterpart of the first embodiment described above. The additional insulating layers other than the first insulating layer 21 and the second insulating layer 22 may be made of a material with appropriate electrical insulation properties. The conductor wirings 3 other, than the conductor wirings 31 and 32 may be made of copper, for example. However, this is only an example and should not be construed as limiting.

Next, an exemplary method for manufacturing a printed wiring board 1 according to the second embodiment will be described with reference to FIGS. 5A and 5B. In this example, a printed wiring board 1 including six insulating layers 2 and seven layers of conductor wirings 3 is manufactured This printed wiring board 1 includes three third insulating layers 23 and a single fourth insulating layer 24 as the additional insulating layers other than the first insulating layer 21 and the second insulating layer 22.

First of all, an LCP member 9, a set of prepregs 10, a core member 91, another set of prepregs 11 (hereinafter referred to as "second prepregs 11"), and a metal foil sheet 63 are provided.

The LCP member 9, the prepregs 10, and the metal foil sheet 63 may be the same as their counterparts 9, 10, and 63 according to the first embodiment.

The core member 91 includes three third insulating layers 23 and four layers of conductor wirings 3 (34). The core member 91 may be made by any appropriate known method. For example, the metal foil sheets of a double-sided metal-clad laminate are patterned to form conductor wirings 34. Then, prepregs and metal foil sheets are sequentially stacked on both sides and the assembly is subjected to hot pressing to obtain a multilayer plate. Subsequently, the metal foil sheets on both sides of the multilayer plate are patterned to form conductor wirings 34 and a through hole 12 is cut through the multilayer plate as needed, thus making the core member 91.

Each of the second prepregs 11 may include a base member and a dried or semi-cured thermosetting composition impregnated into the base member. The base member may be a glass fiber base member, for example. The second prepregs. 11 may or may not have the same configuration as the prepregs 10 according to the first embodiment.

Figure 5A:
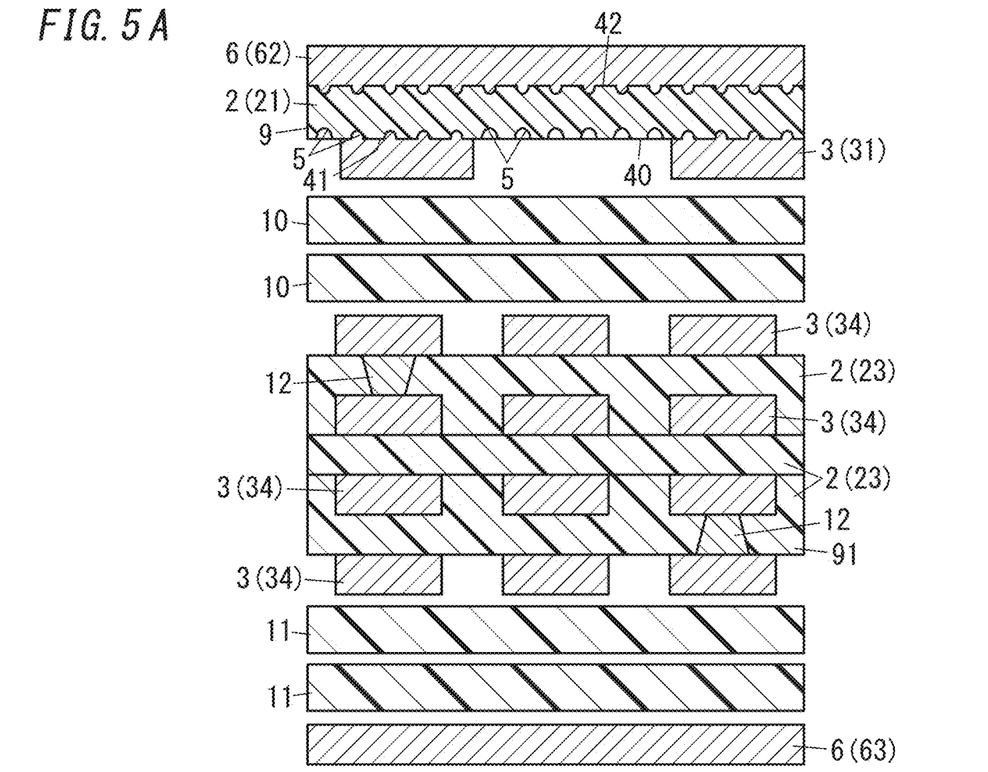
FIGS. 5A and 5B are schematic cross-sectional views illustrating manufacturing process steps of the printed wiring board shown in FIG. 4.
Figure 5B:
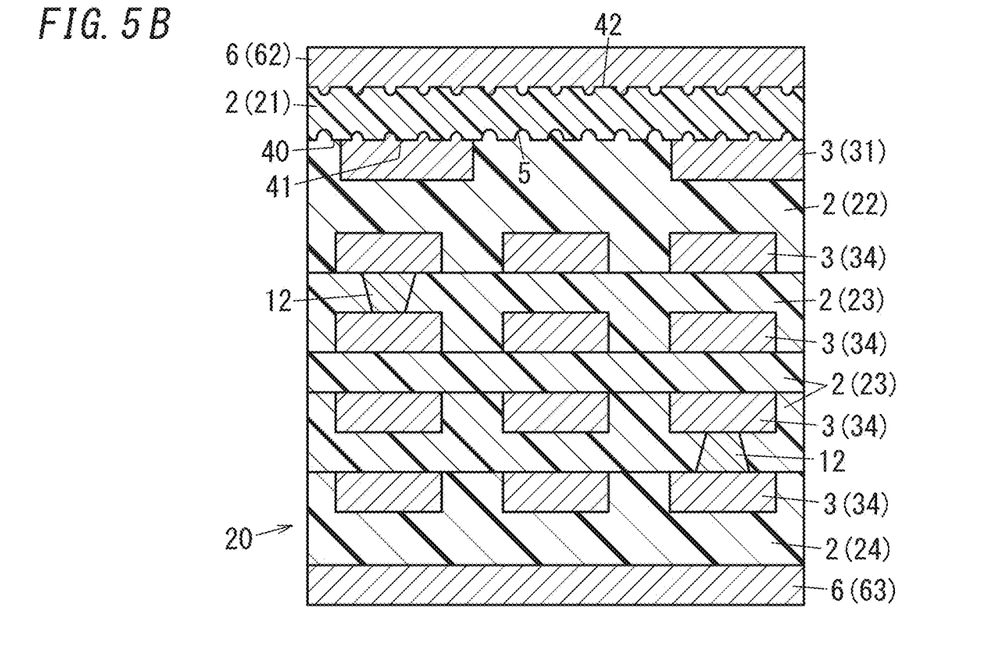

As shown in FIG. 5A, the LCP member 9, the prepregs 10, the core member 91, the second prepregs 11, and the metal foil sheet 63 are stacked one on top of another in this order to obtain a multilayer structure. In this multilayer structure, in the LCP member 9, the prepregs 10 are stacked on the first insulating layer 21, the conductor wiring 31 is interposed between the first insulating layer 21 and the prepregs 10, and the first insulating layer 21 is in contact with the prepregs 10 at the region 40 with the depressions.

This multilayer structure is subjected to hot pressing. The hot pressing process may be conducted under conditions including a heating temperature falling within the range from 170 to 210° C., a pressing pressure falling within the range from 3.5 to 4.0 MPa, and a heating duration falling within the range from 60 to 150 minutes. This hot pressing causes the prepregs 10 to be once melted and then cured to turn into the second insulating layer 22, which is then bonded to the LCP member 9 and the core member 91. In addition, the second prepregs 11 are also once melted and then cured to turn into the fourth insulating layer 24, which is then bonded to the core member 91 and the metal foil sheet 63. In this manner, an intermediate product 20 such as the one shown in FIG. 5B is obtained.

Subsequently, the two metal foil sheets 62 and 63 respectively forming the two outermost layers of the intermediate product 20 are patterned by etching, for example, into conductor wirings 32 and 33. If necessary, a through hole may be cut through the first insulating layer 21 and the fourth insulating layer 24. In this manner, a printed wiring board 1 such as the one shown in FIG. 4 is completed.

Optionally, changing the number of the third insulating layers 23 and the number of layers of the conductor wirings 34 in the core member 91 allows the printed wiring board 1 to have any of various numbers of insulating layers 2 and conductor wirings 3.

As can be seen from the foregoing description, the printed wiring board 1 according to the second embodiment includes the conductor wiring 31 stacked on the first surface 41 of the first insulating layer 21. Instead of such a conductor wiring 31, the printed wiring board 1 may include a non-patterned metal layer stacked on the second surface 41 of the first insulating layer 21 just like the metal foil sheet 62 of the intermediate product 20. In addition, the printed wiring board 1 according to the second embodiment also includes the conductor wiring 33 stacked on the other surface, opposite from the one facing the first insulating layer 21, of the fourth insulating layer 24. Instead of such a conductor wiring 33, the printed wiring board 1 may include a non-patterned metal layer stacked on the other surface, opposite from the one facing the first insulating layer 21, of the fourth insulating layer 24 just like the metal foil sheet 63 of the intermediate product 20. That is to say, the printed wiring board 1 may include a non-patterned metal layer as at least one of the two outermost layers thereof. Optionally, even the intermediate product 20 may be used as it is as the printed wiring board 1.

EXAMPLES

Specific examples of the present invention will now be presented. Note that the present invention is in no way limited to the following examples.

(1) Making LCP Member

Samples 1-1 through 1-5 were made in the following manner as LCP members.

(1-1) Sample 1-1

A liquid crystal polymer film (LCP film (CTZ) manufactured by Kuraray Co., Ltd.) with a thickness of 0.1 mm was provided as the first insulating layer.

A copper foil sheet (with a thickness of 0.018 mm and having protrusions with an average diameter of 0.1 μm on the matted surface) was stacked on each of the two surfaces of the first insulating layer such that the matted surface faced the first insulating layer and then subjected to hot-pressing under conditions including 170° C., 3 MPa, and 60 minutes. Subsequently, the copper foil sheet on one side of the first insulating layer was etched to form a conductor wiring. Next, a region, exposed by etching, (hereinafter referred to as an "exposed region") of the first insulating layer was subjected to plasma treatment with a microwave plasma surface treatment system M120-W (manufactured by Nissin Inc.). The treatment was conducted under the condition that an $O_2/CF_4$ mixed gas (with a $CF_4$ flow rate ratio of 13%) was used as a seed gas, an irradiation duration was 9.4 seconds, and the intensity of resin ashing was 8000 Å. In this manner, the LCP member was made.

Observing the exposed region of the LCP member, the present inventors confirmed the presence of a plurality of depressions. The depressions had an average opening diameter of 0.1 μm and an average depth of 0.1 μm. The sum of the opening areas of the depressions accounted for 90% of the overall area of the exposed region.

(1-2) Sample 1-2

A copper foil sheet with a thickness of 0.018 mm and protrusions with an average diameter of 0.05 μm on the matted surface was used. Other than that, an LCP member was made under the same condition as in Sample 1-1.

Observing the exposed region of the LCP member, the present inventors confirmed the presence of a plurality of depressions. The depressions had an average opening diameter of 0.3 μm and an average depth of 0.3 μm. The sum of the opening areas of the depressions 5 accounted for 80% of the overall area of the exposed region.

(1-3) Sample 1-3

A copper foil sheet with a thickness of 0.012 mm and protrusions with an average diameter of 1 μm on the matted surface was used. Other than that, an LCP member was made under the same condition as in Sample 1-1.

Observing the exposed region of the LCP member, the present inventors confirmed the presence of a plurality of depressions. The depressions had an average opening diameter of 1 μm and an average depth of 1 μm. The sum of the opening areas of the depressions accounted for 85% of the overall area of the exposed region.

(1-4) Sample 1-4

A copper foil sheet with a thickness of 0.012 mm and protrusions with an average diameter of 1.2 μm on the matted surface was used. Other than that, an LCP member was made under the same condition as in Sample 1-1.

Observing the exposed region of the LCP member, the present inventors confirmed the presence of a plurality of depressions. The depressions had an average opening diameter of 1.2 μm and an average depth of 1.2 μm. The sum of the opening areas of the depressions 5 accounted for 60% or less of the overall area of the exposed region.

(1-5) Sample 1-5

A copper foil sheet with a thickness of 0.012 mm and protrusions with an average diameter of 0.05 μm on the matted surface was used. Other than that, an LCP member was made under the same condition as in Sample 1-1.

Observing the exposed region of the LCP member, the present inventors confirmed the presence of a plurality of depressions. The depressions had an average opening diameter of 0.05 μm and an average depth of 0.05 μm. The sum of the opening areas of the depressions accounted for 60% or less of the overall area of the exposed region.

Figure 6A:
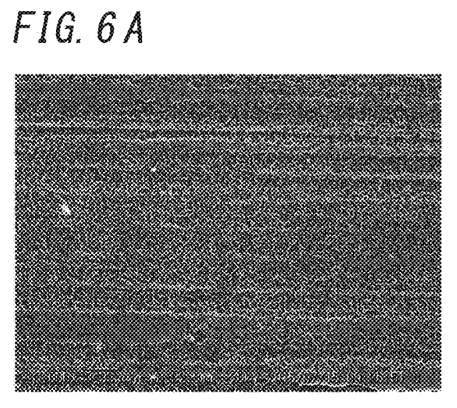
FIG. 6A is an image of an exposed region shot with a scanning electron microscope at a magnification of 3,000× while Sample 1-2 was being provided as an LCP member and before the sample was subjected to plasma treatment.
Figure 6B:
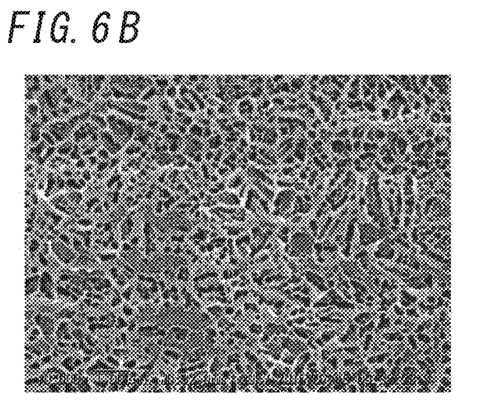
FIG. 6B is an image of the exposed region shot with a scanning electron microscope at a magnification of 10,000× before the sample was subjected to the plasma treatment.
Figure 6C:
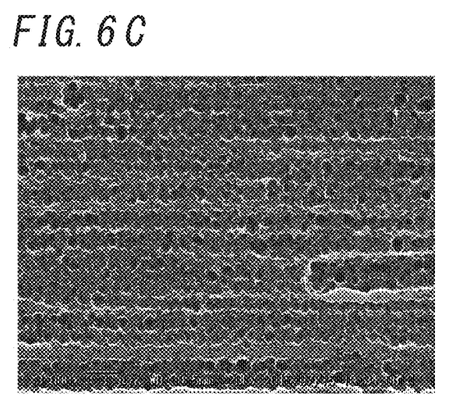
FIG. 6C is an image of the exposed region shot with a scanning electron microscope at a magnification of 3,000× while the Sample 1-2 was being provided and after the sample had been subjected to the plasma treatment.
Figure 6D:
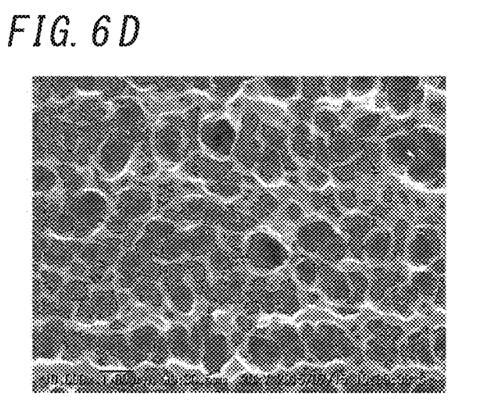
FIG. 6D is an image of the exposed region shot with a scanning electron microscope at a magnification of 10,000× after the sample had been subjected to the plasma treatment.
Figure 7A:
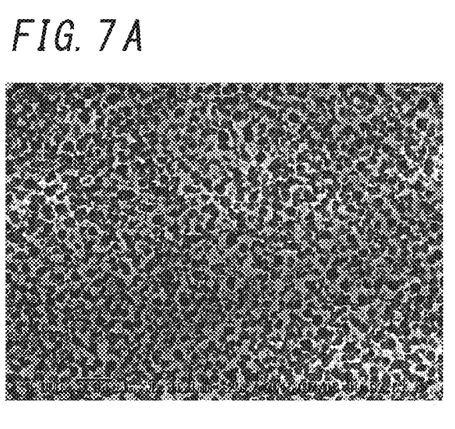
FIG. 7A is an image of an exposed region shot with a scanning electron microscope at a magnification of 3,000× while Sample 1-3 was being provided as an LCP member and before the sample was subjected to plasma treatment.
Figure 7B:
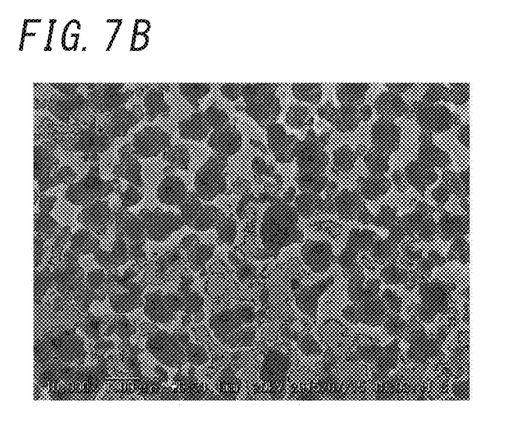
FIG. 7B is an image of the exposed region shot with a scanning electron microscope at a magnification of 10,000× before the sample was subjected to the plasma treatment.
Figure 7C:
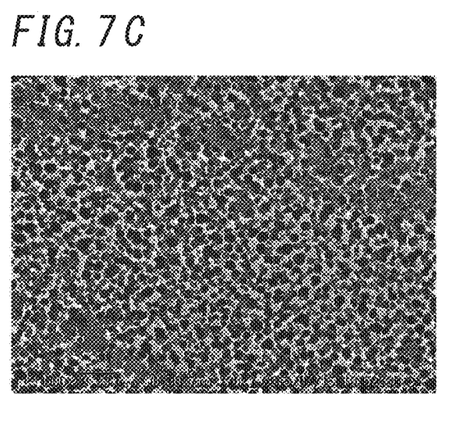
FIG. 7C is an image of the exposed region shot with a scanning electron microscope at a magnification of 3,000× while the Sample 1-3 was being provided and after the sample had been subjected to the plasma treatment.
Figure 7D:
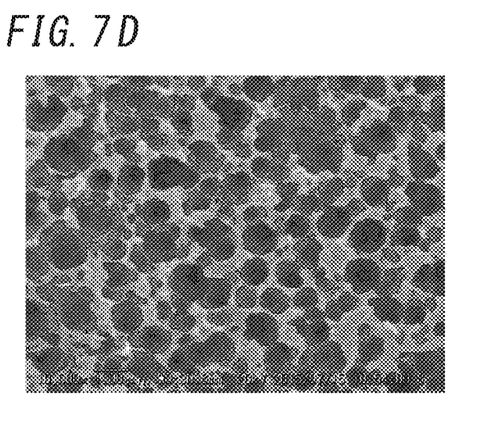
FIG. 7D is an image of the exposed region shot with a scanning electron microscope at a magnification of 10,000× after the sample had been subjected to the plasma treatment.

FIG. 6A is an image of an exposed region shot with a scanning electron microscope at a magnification of 3,000× while Sample 1-2 was being provided as an LCP member and before the sample was subjected to plasma treatment. FIG. 6B is an image of the exposed region shot with a scanning electron microscope at a magnification of 10,000× before the sample was subjected to the plasma treatment. FIG. 6C is an image of the exposed region shot with a scanning electron microscope at a magnification of 3,000× while the Sample 1-2 was being provided and after the sample had been subjected to the plasma treatment. FIG. 6D is an image of the exposed region shot with a scanning electron microscope at a magnification of 10,000× after the sample had been subjected to the plasma treatment. FIG. 7A is an image of an exposed region shot with a scanning electron microscope at a magnification of 3,000× while Sample 1-3 was being provided as an LCP member and before the sample was subjected to plasma treatment. FIG. 7B is an image of the exposed region shot with a scanning electron microscope at a magnification of 10,000× before the sample was subjected to the plasma treatment. FIG. 7C is an image of the exposed region shot with a scanning electron microscope at a magnification of 3,000× while the Sample 1-3 was being provided and after the sample had been subjected to the plasma treatment. FIG. 7D is an image of the exposed region shot with a scanning electron microscope at a magnification of 10,000× after the sample had been subjected to the plasma treatment.

TABLE 1

|  | Sample No. | | | | |
| --- | --- | --- | --- | --- | --- |
|  | 1-1 | 1-2 | 1-3 | 1-4 | 1-5 |
| Average opening diameter (μm) of depressions | 0.1 | 0.5 | 1.0 | 1.2 | 0.05 |
| Average depth (μm) of depressions | 0.1 | 0.5 | 1.0 | 1.2 | 0.05 |
| Ratio (%) of sum of opening areas of depressions to overall area of exposed surface | 90 | 80 | 85 | ≤60% | ≤60% |
| Ratio (%) of sum of opening areas of depressions to overall area of exposed surface | ≥60% | ≥60% | ≥60% | ≤60% | ≤60% |
| SEM photograph (3000x) before plasma treatment |  | FIG. 6A | FIG. 7A |  |  |
| SEM photograph (10000x) before plasma treatment |  | FIG. 6B | FIG. 7B |  |  |
| SEM photograph (3000x) after plasma treatment |  | FIG. 6C | FIG. 7C |  |  |
| SEM photograph (10000x) after plasma treatment |  | FIG. 6D | FIG. 7D |  |  |

(2) Providing Prepreg (2-1) Samples

The following Samples 2-1 and 2-2 were provided as prepregs:

Sample 2-1: Product Number R-1566 (WN) manufactured by Panasonic Corporation, halogen-free, and containing, as an inorganic filler, aluminum hydroxide treated with a coupling agent; and Sample 2-2: Product Number R-1566 manufactured by Panasonic Corporation, halogen-free, and containing, as an inorganic filler, aluminum hydroxide.

(2-2) Index Temperature of Cured Product

Five layers of each sample were stacked one on top of another and thermally pressed under treatment conditions including 170° C., 3 MPa, and 60 minutes to make a cured product. The temperature at which this cured product lost 5% of its mass was measured by thermogravimetric-differential thermal analysis (TG/DTA). The results are shown in the following Table 2.

(2-3) Lowest Melt Viscosity

Each sample had its temperature increased from 80° C. to 150° C. at a temperature increase rate of 2° C./min to have its lowest melt viscosity measured with a flow tester. The results are shown in the following Table 2.

TABLE 2

|  | Sample Number | |
| --- | --- | --- |
|  | 2-1 | 2-2 |
| Product number | R-1566 (WN) | R-1566 |
| Inorganic filler | Aluminum hydroxide | Aluminum hydroxide |
| Coupling agent | Contained | Not contained |
| Halogen-free? | YES | YES |
| Index temperature (° C.) of cured product | 355 | 350 |
| Lowest melt viscosity (Pa · s) | 200 | 200 |

(3) Manufacturing Printed Wiring Board

A copper foil sheet with a thickness of 35 five layers of prepregs, and an LCP member were stacked one on top of another in this order and thermally pressed under treatment conditions including 170° C., 3 MPa, and 60 minutes, thus manufacturing a printed wiring board 1. The respective sample numbers of prepregs and LCP members used in specific examples and comparative examples are as shown in the following Table 3:

(4) Evaluation Test (4-1) Evaluating T288

T288 between the first insulating layer and second insulating layer of the printed wiring board was measured by a mechanical test method (thermomechanical analysis (TMA) method) defined by IPC-TM-650 2.4 24.1.

(4-2) Measuring Interfacial Bond Strength

A strip of a sample with a width of 10 mm and a length of 200 mm was cut out of the printed wiring board. The interface between the first insulating layer and second insulating layer of the sample was incised, allowed to partially delaminate once, and then had its interfacial bond strength measured with an autograph instrument.

(4-3) Evaluating Degree of Close Contact During Heating

The printed wiring board 1 was repeatedly subjected to reflow treatment five times under such a heating condition that the board was heated to 260° C. or more for 17 seconds in total. Every time the reflow treatment was carried out, the printed wiring board had its surface appearance observed to see if there was any delamination between the first insulating layer 21 and second insulating layer 22 of the printed wiring board 1. Determination was made that delamination should have occurred when any swelling was detected on the surface. Based on this result, the number of times the treatment had been carried out before the delamination occurred was confirmed.

TABLE 3

|  | Examples | | | | | | | | Comparative Examples | | |
| --- | --- | --- | --- | --- | --- | --- | --- | --- | --- | --- | --- |
|  | 1 | 2 | 3 | 4 | 5 | 6 | 7 | 8 | 1 | 2 | 3 |
| Sample Number of LCP Member | 1-5 | 1-1 | 1-2 | 1-3 | 1-4 | 1-1 | 1-2 | 1-3 | 1-1 | 1-2 | 1-3 |
| Sample Number of Prepreg | 2-1 | 2-1 | 2-1 | 2-1 | 2-1 | 2-1 | 2-1 | 2-1 | 2-2 | 2-2 | 2-2 |
| T288 (min.) | 10 | 10 | 10 | 10 | 10 | >120 | >120 | >120 | 3 | 3 | 3 |
| Interfacial Bond Strength (kN/m) | 1.2 | 1.9 | 1.9 | 1.9 | 1.2 | 1.9 | 1.9 | 1.9 | 1.9 | 1.9 | 1.9 |

TABLE 3-continued

|  | Examples | | | | | | | | Comparative Examples | | |
| --- | --- | --- | --- | --- | --- | --- | --- | --- | --- | --- | --- |
|  | 1 | 2 | 3 | 4 | 5 | 6 | 7 | 8 | 1 | 2 | 3 |
| Degree of close contact during heating (times) | 2 | >5 | >5 | >5 | 3 | >5 | >5 | >5 | 1 | 1 | 1 |

REFERENCE SIGNS LIST

1 Printed Wiring Board
21 First Insulating Layer
22 Second Insulating Layer
3 Conductor Wiring
41 First Surface
42 Second Surface
5 Depression
6 Metal Foil Sheet
7 Matted Surface
8 Protrusion
9 Liquid Crystal Polymer Base Member (LCP Member)
10 Prepreg

The invention claimed is:

1. A printed wiring board comprising:
a first insulating layer having a first surface and a second surface opposite from the first surface;
a second insulating layer stacked on the first surface of the first insulating layer; and
a conductor wiring interposed between the first insulating layer and the second insulating layer,
the first insulating layer containing a liquid crystal polymer,
the second insulating layer containing a cured product of a thermosetting composition and a fibrous base member, the thermosetting composition containing an inorganic filler and a thermosetting component,
the second insulating layer having such a property that a temperature, at which a decrease in the mass of the second insulating layer that has had its temperature increased at a temperature increase rate of 10° C./min from an initial-state temperature of 25° C. reaches 5% of its initial-state mass, is equal to or higher than 355° C. when measured by thermogravimetric-differential thermal analysis; wherein
the first surface of the first insulating layer has a region that is in contact with the second insulating layer, the region having a plurality of depressions, and the plurality of depressions having an average opening diameter within a range from 0.1 μm to 1.0 μm.

2. The printed wiring board of claim 1, wherein the plurality of depressions is formed by transferring a shape of protrusions, having an average diameter of 0.1 to 1.0 μm and present on a matted surface of a metal foil sheet, onto the first insulating layer.

3. The printed wiring board of claim 1, wherein the plurality of depressions is formed by transferring a shape of protrusions, having an average diameter less than 1.0 μm and present on a matted surface of a metal foil sheet, onto the first insulating layer and then subjecting the first insulating layer to plasma treatment.

4. The printed wiring board of claim 1, wherein the thermosetting component contains an epoxy compound.

5. The printed wiring board of claim 4, wherein the second insulating layer is halogen-free.

6. The printed wiring board of claim 1, wherein the inorganic filler contains aluminum hydroxide.

7. The printed wiring board of claim 1, further comprising a metal layer stacked on the second surface of the first insulating layer.

8. The printed wiring board of claim 1, further comprising a conductor wiring stacked on the second surface of the first insulating layer.

9. A method for manufacturing the printed wiring board of claim 1, the method comprising:
providing a first insulating layer containing a liquid crystal polymer, a metal foil sheet having a matted surface with a plurality of protrusions having an average diameter falling within a range from 0.1 μm to 1.0 μm, and a prepreg, the prepreg having a property of turning into a cured product when cured, the cured product having such a property that a temperature, at which a decrease in the mass of the cured product that has had its temperature increased at a temperature increase rate of 10° C./min from an initial-state temperature of 25° C. reaches 5% of its initial-state mass, is equal to or higher than 355° C. when measured by thermogravimetric-differential thermal analysis;
putting the matted surface of the metal foil sheet on the first insulating layer to make thermal compression bonding of the metal foil sheet onto the first insulating layer;
etching and patterning the metal foil sheet into a conductor wiring; and
putting the prepreg over the surface, having the conductor wiring, of the first insulating layer and heating and curing the prepreg to form a second insulating layer.

10. A method for manufacturing the printed wiring board of claim 1, the method comprising:
providing a first insulating layer containing a liquid crystal polymer, a metal foil sheet having a matted surface with a plurality of protrusions having an average diameter less than 1.0 μm, and a prepreg, the prepreg having a property of turning into a cured product when cured, the cured product having such a property that a temperature, at which a decrease in the mass of the cured product that has had its temperature increased at a temperature increase rate of 10° C./min from an initial-state temperature of 25° C. reaches 5% of its initial-state mass, is equal to or higher than 355° C. when measured by thermogravimetric-differential thermal analysis;
putting the matted surface of the metal foil sheet on the first insulating layer to make thermal compression bonding of the metal foil sheet onto the first insulating layer;
etching and patterning the metal foil sheet into a conductor wiring; and
subjecting a surface, exposed by etching, of the first insulating layer to plasma treatment, putting the prepreg over the first insulating layer to make the prepreg face the conductor wiring, and heating and curing the prepreg to form a second insulating layer.

* * * * *